(12) United States Patent
Chou

(10) Patent No.: US 8,296,611 B2
(45) Date of Patent: Oct. 23, 2012

(54) TEST CIRCUIT FOR INPUT/OUTPUT ARRAY AND METHOD AND STORAGE DEVICE THEREOF

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 396 days.

(21) Appl. No.: 12/748,455

(22) Filed: Mar. 29, 2010

(65) Prior Publication Data

US 2011/0239046 A1    Sep. 29, 2011

(51) Int. Cl.
*G11C 29/00* (2006.01)
*H03M 13/00* (2006.01)

(52) U.S. Cl. ........ 714/722; 714/718; 714/719; 714/760; 365/200; 365/201

(58) Field of Classification Search .................. 714/718, 714/719, 722, 760; 365/200, 201
See application file for complete search history.

(56) References Cited

U.S. PATENT DOCUMENTS

| | | | | |
|---|---|---|---|---|
| 5,646,948 A | * | 7/1997 | Kobayashi et al. | 714/719 |
| 6,421,794 B1 | * | 7/2002 | Chen et al. | 714/42 |
| 6,879,530 B2 | * | 4/2005 | Callaway et al. | 365/201 |
| 7,046,563 B1 | | 5/2006 | Kim | |
| 7,669,100 B2 | * | 2/2010 | Pelley | 714/732 |
| 7,890,831 B2 | * | 2/2011 | Choate et al. | 714/742 |
| 2009/0177866 A1 | * | 7/2009 | Choate et al. | 712/200 |

OTHER PUBLICATIONS

Tremlay et al., Support for Fault Tolerance in VLSI Processors, May 1989, Proceedings of the International Symposium on Circuits and Systems Portland, Oregon, pp. 388-393.*

* cited by examiner

*Primary Examiner* — John J Tabone, Jr.
(74) *Attorney, Agent, or Firm* — Jianq Chyun IP Office

(57) ABSTRACT

The invention provides a test circuit for n input/output arrays. Each of the n input/output arrays has M pairs of input/output. The test circuit includes M write drivers and M comparing circuits. The $i^{th}$ write driver provides an $i^{th}$ test signal to the $i^{th}$ inputs of all of the n input/output arrays, and $1 \leq i \leq M$. The $j^{th}$ comparing circuit determines if $j^{th}$ output signals of all of the n input/output arrays are the same, and outputs a $j^{th}$ comparing result correspondingly, and $1 \leq j \leq M$. The invention also provides a method of testing n input/output arrays. The invention also provides a storage device.

15 Claims, 5 Drawing Sheets

TEST CIRCUIT FOR INPUT/OUTPUT ARRAY AND METHOD AND STORAGE DEVICE THEREOF

FIELD OF THE INVENTION

The invention generally relates to the test circuit, more particular, to the test circuit for input/output arrays.

DESCRIPTION OF RELATED ART

Memory is used to store the information. For recent years, the requirement of the memory is more and more demanding. The basic function for a memory includes "read" and "write". Memory can be categorized into two groups: read only memory (ROM) and random access memory (RAM), such as dynamic random access memory (dynamic RAM, or DRAM).

After being fabricated, the memory cells need to be tested. During memory testing, data is written into the memory cells and then the data is read from the memory cells. As the density of the memory array increases, the time for fully testing the memory array also increases.

One technique used to decrease test time is data compression. That is, data read from multiple memory cells is compressed. Thus, less data communication connections (DQ's) are required for a given number of memory cells when implementing data compression. The data compression circuitry is included in the memory and causes data paths overhead for "read" and "write" functions. The data paths overhead may decrease operation speed during normal, non-test operations. Therefore, the way for data compression is an important issue of memory testing.

SUMMARY OF THE INVENTION

The invention provides a test circuit for n input/output arrays. Each of the n input/output arrays has M pairs of input/output. The test circuit includes M write drivers and M comparing circuits. The $i^{th}$ write driver provides an $i^{th}$ test signal to the $i^{th}$ inputs of all of the n input/output arrays, and $1 \leq i \leq M$. The $j^{th}$ comparing circuit determines if $j^{th}$ output signals of all of the n input/output arrays are the same, and outputs a $j^{th}$ comparing result correspondingly, and $1 \leq j \leq M$.

According to an embodiment of the invention, the test circuit further includes M buffers. The M buffers are coupled between the M write drivers and the M comparing circuits for buffering the M comparing results.

According to an embodiment of the invention, each of the M comparing circuits includes a plurality of 2-to-1 comparators and an AND gate. Each of the 2-to-1 comparators determines if the two $j^{th}$ output signals of two of the n input/output arrays are the same, and accordingly outputs a 2-to-1 comparing result. The AND gate performs a logic and operation on all of the 2-to-1 comparing results, and outputs the $j^{th}$ comparing result correspondingly.

According to an embodiment of the invention, each of the M comparing circuits includes a plurality of 3-to-1 comparators and an AND gate. Each of the 3-to-1 comparators determines if the three $j^{th}$ output signals of three of the n input/output arrays are the same, and accordingly outputs a 3-to-1 comparing result. The AND gate performs a logic and operation on all of the 3-to-1 comparing results, and outputs the $j^{th}$ comparing result correspondingly.

The invention provides a storage device which includes n input/output arrays and a test circuit. Each of the n input/output arrays has M pairs of input/output. The test circuit is coupled to the n input/output arrays and includes M write drivers and M comparing circuits. The $i^{th}$ write driver provides an $i^{th}$ test signal to the $i^{th}$ inputs of all of the n input/output arrays, and $1 \leq i \leq M$. The $j^{th}$ comparing circuit determines if $j^{th}$ output signals of all of the n input/output arrays are the same, accordingly outputs a $j^{th}$ comparing result, and $1 \leq j \leq M$.

The invention provides a method of testing n input/output arrays. Each of the n input/output arrays has M pairs of input/output. The method includes at least two steps. One step of the method is providing M write drivers. Wherein the $i^{th}$ write driver outputs a test signal to the $i^{th}$ inputs of all of the n input/output arrays, and $1 \leq i \leq M$. Another step of the method is providing M comparing circuits. Wherein the $j^{th}$ comparing circuit determines if $j^{th}$ output signals of all of the n input/output arrays are the same, and outputs a $j^{th}$ comparing result correspondingly, and $1 \leq j \leq M$.

According to an embodiment of the invention, the method of testing n input/output arrays further includes a step of providing M buffers coupled between the M write drivers and the M comparing circuits, so as to buffer the M comparing results.

According to an embodiment of the invention, the step of providing M comparing circuits includes two steps. One step of providing M comparing circuits is providing a plurality of 2-to-1 comparators. Wherein each of the 2-to-1 comparators determines if the two $j^{th}$ output signals of two of the n input/output arrays are the same, and accordingly outputs a 2-to-1 comparing result. Another step of providing M comparing circuits is providing an AND gate to perform a logic and operation on all of the 2-to-1 comparing results, and to output the $j^{th}$ comparing result correspondingly.

According to an embodiment of the invention, the step of providing M comparing circuits includes two steps. One step of providing M comparing circuits is providing a plurality of 3-to-1 comparators. Wherein each of the 3-to-1 comparators determines if the three $j^{th}$ output signals of three of the n input/output arrays are the same, and accordingly outputs a 3-to-1 comparing result. Another step of providing M comparing circuits is providing an AND gate to perform a logic and operation on all of the 3-to-1 comparing results, and to output the $j^{th}$ comparing result correspondingly.

With such configuration, the test circuit can be test with all the combination of the test signals for the input/output arrays. As described above, the storage device including a test circuit and the input/output arrays can do self-test with all the combination of the test signals. In addition, the comparing circuit of the test circuit can do test for some specific faults.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
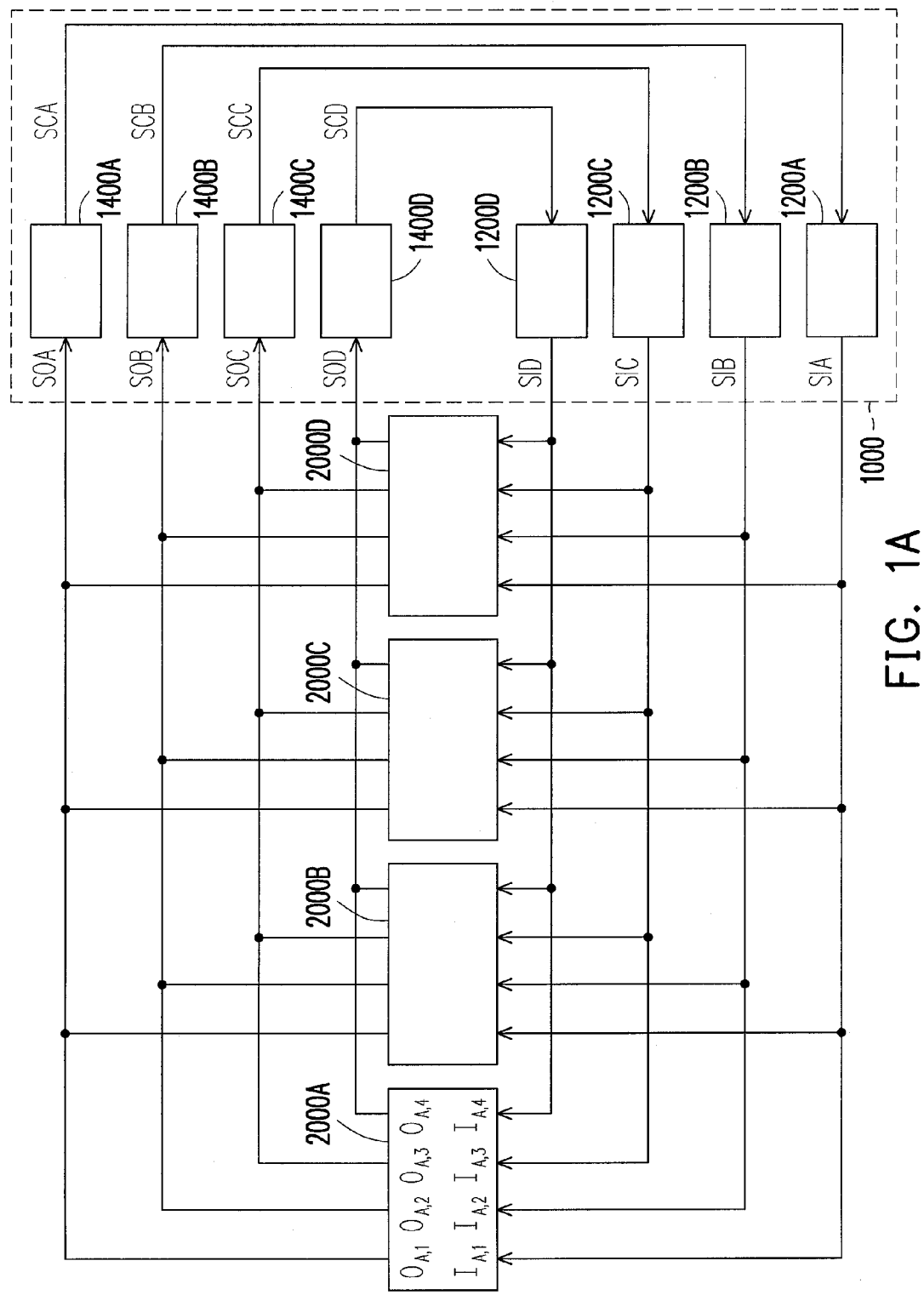
FIG. 1A shows a block diagram of a storage device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A shows a block diagram of a storage device according to an embodiment of the invention. The storage device includes n input/output arrays and a test circuit, wherein n is a positive integer and "n input/output arrays" refers to the number of input/output arrays being n. Referring to FIG. 1A, in the embodiment, n is four, that is, the number of the input/output arrays is four. The storage device 3000 includes a test circuit 1000 and four input/output arrays 2000A~2000D. Each of the n input/output arrays has M pairs of input/output, wherein M is a positive integer. In the embodiment, M is four, that is, the number of the pairs of input/output is four. That is, in the embodiment n is equal to M. It is noted that n may be not equal to M in the other embodiment, and therefore the value of n is not used to limit the invention. Each of the four input/output arrays 2000A~2000D has 4 pairs of input/output. For example, the input/output array 2000A has inputs $I_{A,1}$~$I_{A,4}$ and corresponding outputs $O_{A,1}$~$O_{A,4}$. The test circuit 1000 is coupled to the four input/output arrays 2000A~2000D.

The test circuit includes M write drivers and M comparing circuits. In the embodiment, the test circuit 1000 includes four write drivers 1200A~1200D and four 4-to-1 comparing circuits 1400A~1400D. The $i^{th}$ write driver of the four write drivers 1200A~1200D provides an $i^{th}$ test signal to the $i^{th}$ inputs of all of the n input/output arrays, and $1 \leq i \leq M$. In the embodiment, for example, the $1^{st}$ write driver 1200A of the four write drivers 1200A~1200D provides an $1^{st}$ test signal SIA to the $1^{st}$ inputs of all of the four input/output arrays 2000A~2000D, such as $I_{A,1}$, $I_{B,1}$, $I_{C,1}$, and $I_{D,1}$. The configuration of $2^{nd}$, $3^{rd}$, and $4^{th}$ write driver 1200B, 1200C, and 1200D is similar to that of the $1^{st}$ write driver 1200A and is not repeatedly described.

The $j^{th}$ comparing circuit of M comparing circuits determines if $j^{th}$ output signals of all of the n input/output arrays are the same, accordingly outputs a $j^{th}$ comparing result, and $1 \leq j \leq M$. In the embodiment, for example, the $1^{st}$ 4-to-1 comparing circuit 1400A of the four 4-to-1 comparing circuits 1400A~1400D determines if $1^{st}$ output signals SOA (comprising the output signals SOA1~SOA4 in FIG. 2) of all of the four input/output arrays 2000A~2000D are the same, accordingly outputs a $1^{st}$ comparing result SCA. The configuration of the comparing circuits 1400B-1400D are similar to that of the comparing circuit 1400A and is not repeatedly herein. It is noted that, the signal SOA~SOD are output signal bus. For example, the output signal bus SOA includes the $1^{st}$ output signals of all of the four input/output arrays 2000A~2000D, such as $O_{A,1}$, $O_{B,1}$, $O_{C,1}$, and $O_{D,1}$.

With such configuration, the input/output arrays 2000A~2000D receives the test signals SIA~SID from the four write drivers 1200A~1200D. For example, the input/output arrays 2000A receives the test signals SIA~SID through the $I_{A,1}$, $I_{A,2}$, $I_{A,3}$, and $I_{A,4}$. The configuration of the input/output arrays 2000B-2000D is similar to that of the input/output arrays 2000A and is not repeatedly described. The test signals SIA~SID may have two voltage levels, "0" and "1", however, in other embodiment, the test signals SIA~SID may have more than two levels. In the embodiment, the input/output arrays 2000A~2000D are tested by the test signals SIA~SID which have 16 kinds of combination, such as "0000", "0001", ..., and "1111". In addition, the comparing results SCA~SCD are outputted and may be observed. The test circuit 1000 can be tested with all the combination of the test signals SIA~SID for the input/output arrays 2000A~2000D. Moreover, as described above, the storage device 3000 including a test circuit 1000 and 4 input/output arrays 2000A~2000D can do self-test with all the combination of the test signals SIA~SID.

Figure 1B:
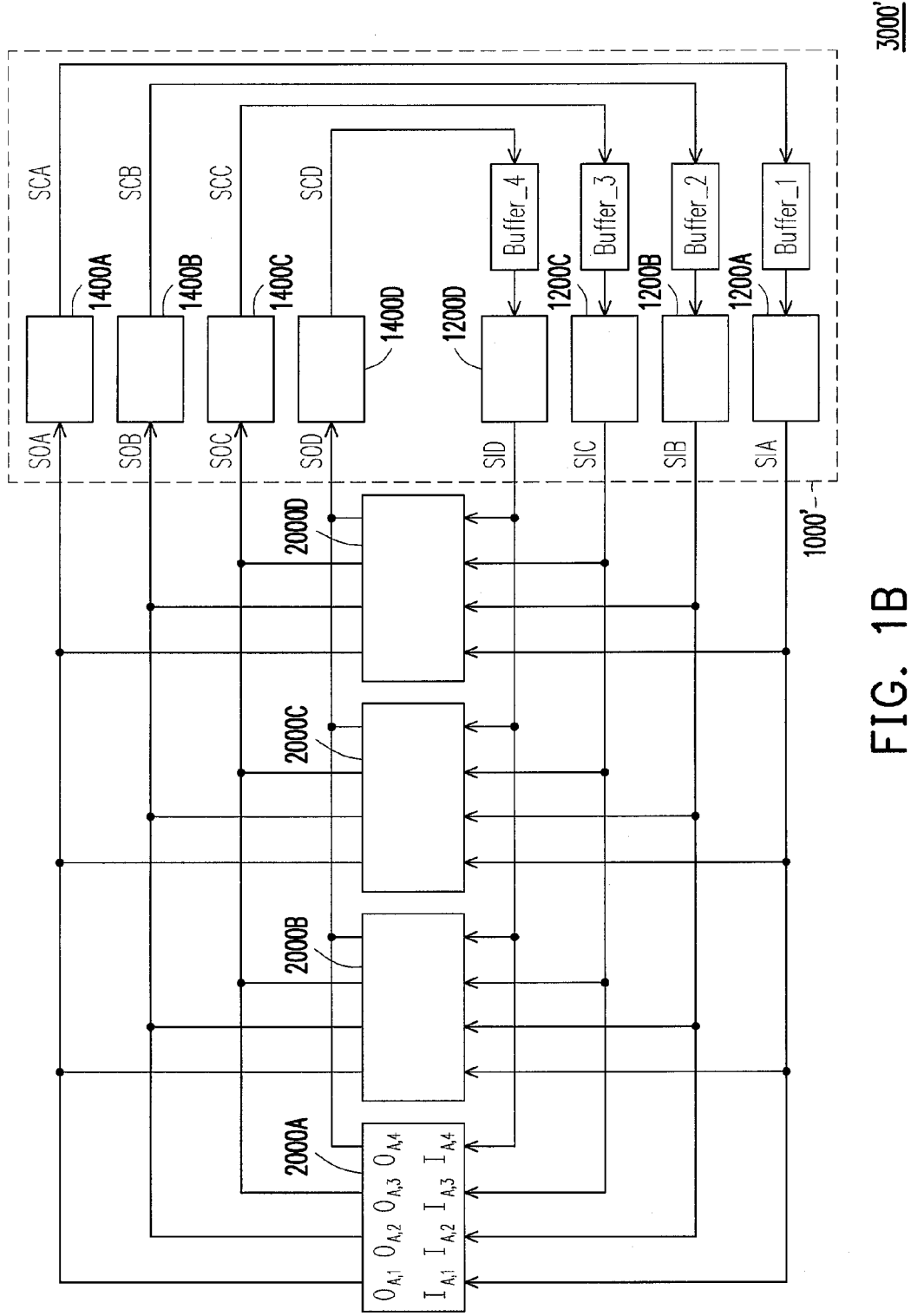
FIG. 1B shows a block diagram of a storage device according to another embodiment of the invention.

The test circuit may further include M buffers coupled between the M write drivers and the M comparing circuits, for buffering the M comparing results. Referring to FIG. 1B, FIG. 1B shows a block diagram of a storage device according to another embodiment of the invention. In the embodiment, the storage device 3000' in FIG. 1B is similar to the storage device 3000 in FIG. 1A, except for the test circuit 1000'. The test circuit 1000' in FIG. 1B further includes four buffers Buffer_1~Buffer_4 coupled between the four write drivers 1200A~1200D and the four 4-to-1 comparing circuits 1400A~1400D for buffering the four comparing results SCA~SCD.

Figure 2:
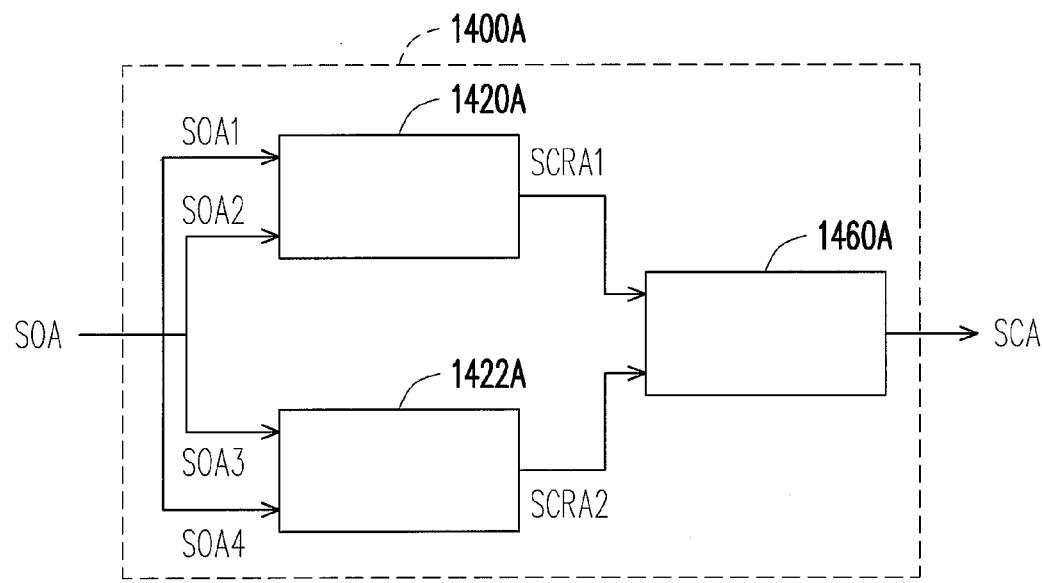
FIG. 2 shows a block diagram of a comparing circuit of the test circuit according to an embodiment of the invention.

FIG. 2 shows a block diagram of a comparing circuit of the test circuit according to an embodiment of the invention. The comparing circuit includes a plurality of 2-to-1 comparators and an AND gate. Referring to FIG. 2, in the embodiment, the comparing circuit 1400A includes two 2-to-1 comparators 1420A, 1422A, and an AND gate 1460A. The comparing circuit 1400B, 1400C, and 1400D may be respectively similar to the comparing circuit 1400A and are not repeatedly described herein.

Each of the 2-to-1 comparators determines if the two $j^{th}$ output signals of two of the n input/output arrays are the same, and accordingly outputs a 2-to-1 comparing result. In the embodiment, for example, the 2-to-1 comparator 1420A determines if the two $1^{st}$ output signals SOA1 and SOA2 of the two input/output arrays 2000A and 2000B are the same, and accordingly outputs a 2-to-1 comparing result SCRA1, and the 2-to-1 comparator 1422A determines if the two $1^{st}$ output signals SOA3 and SOA4 of the two input/output arrays 2000C and 2000D are the same, and accordingly outputs a 2-to-1 comparing result SCRA2. The AND gate performs a logic and operation on all of the 2-to-1 comparing results, and outputs the $j^{th}$ comparing result correspondingly. In the embodiment, the AND gate 1460A performs a logic and operation on all of the 2-to-1 comparing results SCRA1, SCRA2 and outputs the $1^{st}$ comparing result SCA correspondingly.

It is noted that in another embodiment, the 2-to-1 comparator 1420A may determine if the two $1^{st}$ output signals SOA2 and SOA3 of the two input/output arrays 2000B and 2000C are the same, and the 2-to-1 comparator 1422A may determine if the two $1^{st}$ output signals SOA1 and SOA4 of the two input/output arrays 2000A and 2000D are the same. In short, the implementation of the comparing circuit 1400A in FIG. 2 is not used to limit the present invention.

Thus, for the 2-to-1 comparator 1420A, if the $1^{st}$ output signals SOA1 and SOA2 are the same, for example, they are both "0" or both "1", the 2-to-1 comparing results SCRA1 is "1". If not, the 2-to-1 comparing results SCRA1 is "0". For the AND gate 1460A, if the 2-to-1 comparing results SCRA1, SCRA2 are both "1", the $1^{st}$ comparing result SCA is "1". If not, the $1^{st}$ comparing result SCA is "0". Therefore, if the $1^{st}$ output signals SOA1~SOA4 are "1110", then the 2-to-1 comparing results SCRA1 is "1" and the 2-to-1 comparing results SCRA2 is "0", furthermore, the $1^{st}$ comparing result SCA is "0". Hence, the comparing circuit 1400A determines the $1^{st}$ output signals SOA1~SOA4 ("1110") of the $1^{st}$ output signal bus SOA are different. The comparing circuit 1400A of the test circuit 1000 can do test for finding whether some specific faults exist. However, if the $1^{st}$ output signals SOA1~SOA4 are "1100", the $1^{st}$ comparing result SCA is "1". Though the specific fault above exist, the comparing circuit 1400A in FIG. 2 can not find the specific fault, and therefore a comparing circuit of the test circuit according to another embodiment of the invention is provided below.

Figure 3:
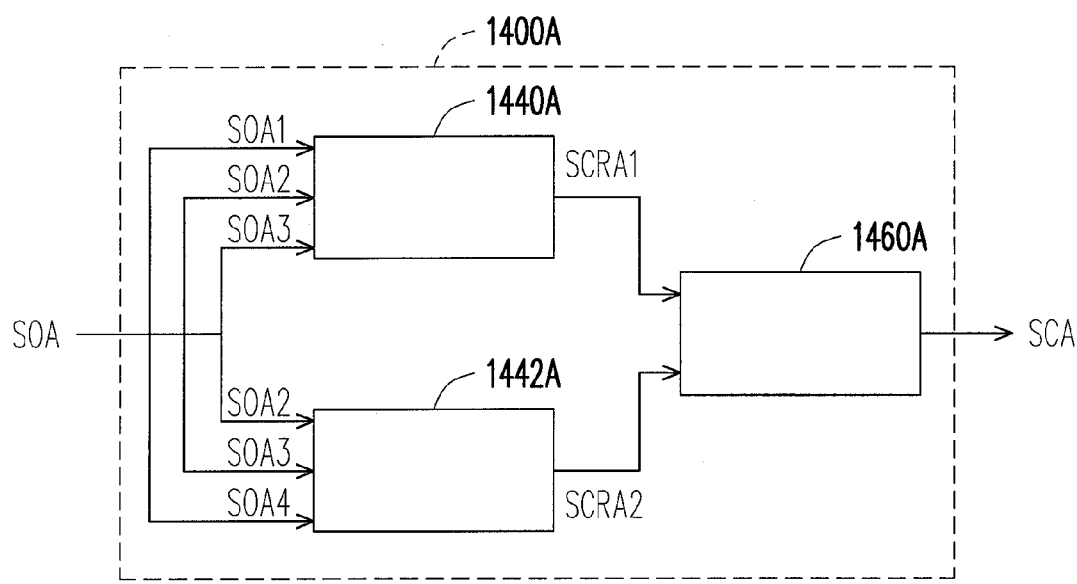
FIG. 3 shows a block diagram of a comparing circuit of the test circuit according to another embodiment of the invention.

FIG. 3 shows a block diagram of a comparing circuit of the test circuit according to another embodiment of the invention. The comparing circuit includes a plurality of 3-to-1 comparators and an AND gate. Referring to FIG. 3, in the embodiment, the comparing circuit 1400A includes two 3-to-1 comparators 1440A, 1442A, and an AND gate 1460A. The comparing circuit 1400B, 1400C, and 1400D may be respectively similar to the comparing circuit 1400A and are not repeatedly described herein.

Each of the 3-to-1 comparators determines if the three $j^{th}$ output signals of three of the n input/output arrays are the same, and accordingly outputs a 3-to-1 comparing result. In the embodiment, for example, the 3-to-1 comparator 1440A determines if the three $1^{st}$ output signals SOA1, SOA2 and SOA3 of the three input/output arrays 2000A, 2000B and 2000C are the same, and accordingly outputs a 3-to-1 comparing result SCRA1, and the 3-to-1 comparator 1442A determines if the three $1^{st}$ output signals SOA2, SOA3 and SOA4 of the three input/output arrays 2000B, 2000C and 2000D are the same, and accordingly outputs a 3-to-1 comparing result SCRA2. The AND gate performs a logic and operation on all of the 3-to-1 comparing results, and outputs the $j^{th}$ comparing result correspondingly. In the embodiment, the AND gate 1460A performs a logic and operation on all of the 3-to-1 comparing results SCRA1, SCRA2 and outputs the $1^{st}$ comparing result SCA correspondingly.

It is noted that in another embodiment, the 3-to-1 comparator 1440A may determine if the three $1^{st}$ output signals SOA1, SOA3, and SOA4 of the three input/output arrays 2000A, 2000C and 2000D are the same, and the 3-to-1 comparator 1442A may determine if the three $1^{st}$ output signals SOA1, SOA2, and SOA4 of the three input/output arrays 2000A, 2000B and 2000D are the same. In short, the implementation of the comparing circuit 1400A in FIG. 3 is not used to limit the present invention.

Thus, for the 3-to-1 comparator 1440A, if the $1^{st}$ output signals SOA1, SOA2 and SOA3 are the same, for example, they are all "0" or all "1", the 3-to-1 comparing results SCRA1 is "1". If not, the 3-to-1 comparing results SCRA1 is "0". For the AND gate 1460A, if the 3-to-1 comparing results SCRA1, SCRA2 are "1", the $1^{st}$ comparing result SCA is "1". If not, the $1^{st}$ comparing result SCA is "0". Therefore, if the $1^{st}$ output signals SOA1~SOA4 are "1100", then the 3-to-1 comparing results SCRA1 is "0" and the 3-to-1 comparing results SCRA2 is "0", furthermore, the $1^{st}$ comparing result SCA is "0". Hence, the comparing circuit 1400A determines the $1^{st}$ output signals SOA1~SOA4 ("1100") of the $1^{st}$ output signal bus SOA are different, even if two same the $1^{st}$ output signals SOA1, SOA2 as "1" are different with two same the $1^{st}$ output signals SOA3, SOA4 as "0". The comparing circuit 1400A of the test circuit 1000 can do test for finding whether some specific faults exist.

Figure 4:
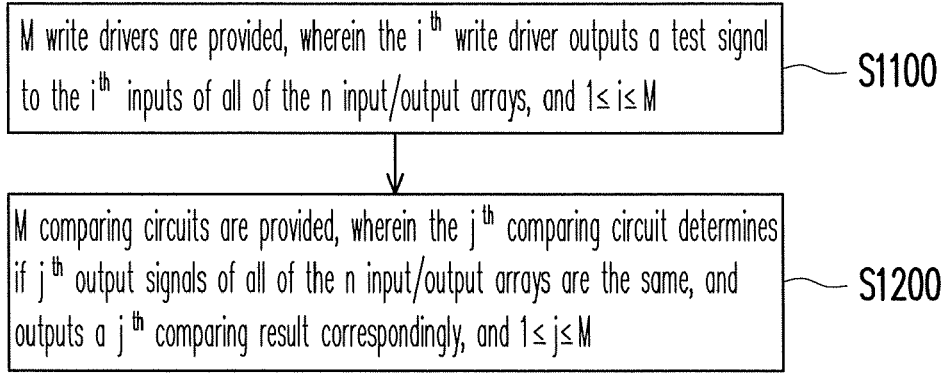
FIG. 4 shows a flow diagram of testing input/output arrays according to an embodiment of the invention.

FIG. 4 shows a flow diagram of testing input/output arrays according to an embodiment of the invention. Each of the n input/output arrays has M pairs of input/output. Referring to FIG. 4, the method includes steps S1100 and S1200. In the step S1100, M write drivers are provided. The $i^{th}$ write driver outputs a test signal to the $i^{th}$ inputs of all of the n input/output arrays, and $1 \leq i \leq M$. In the step S1200, M comparing circuits are provided. The $j^{th}$ comparing circuit determines if $j^{th}$ output signals of all of the n input/output arrays are the same, and outputs a $j^{th}$ comparing result correspondingly, and $1 \leq j \leq M$.

The test signals may have two voltage levels, "0" and "1". However, in other embodiment, the test signals may have more than two levels. In the embodiment, the input/output arrays are tested by the test signals which have 16 kinds of combination, such as "0000", "0001", ..., and "1111". In addition, the comparing results are outputted and may be observed. The test circuit can be tested with all the combination of the test signals for the input/output arrays. Moreover, as described above, the self-test can be done by the storage device including a test circuit and n input/output arrays with all the combination of the test signals.

Figure 5:
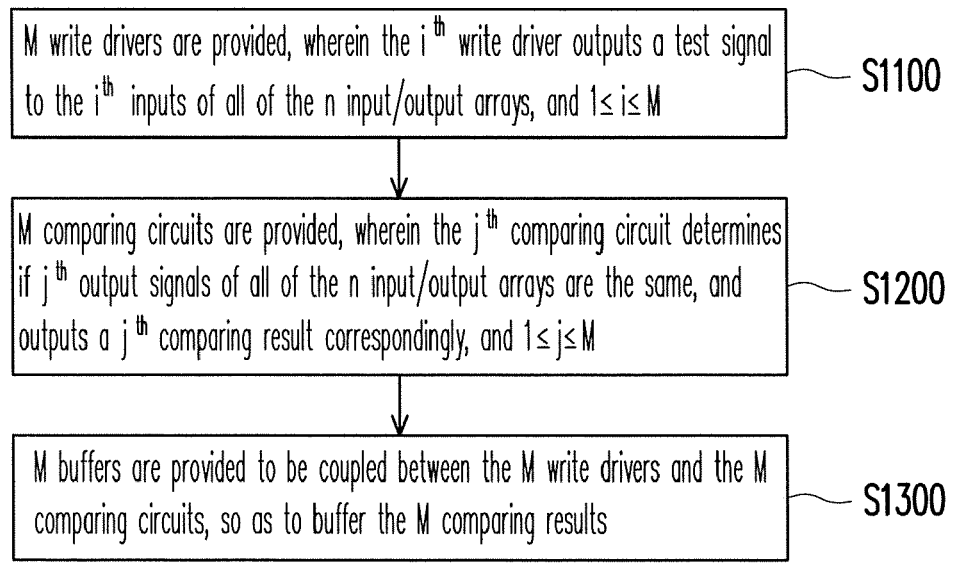
FIG. 5 shows a flow diagram of testing input/output arrays according to another embodiment of the invention.

FIG. 5 shows a flow diagram of testing input/output arrays according to another embodiment of the invention. Each of the n input/output arrays has M pairs of input/output. Referring to FIG. 5, the method includes steps S1100, S1200, and further includes S1300. The steps S1100, S1200 in FIG. 5 are the same as those in FIG. 4 without being repeatedly described herein. In the step S1300, M buffers are provided to be coupled between the M write drivers and the M comparing circuits, so as to buffer the M comparing results.

Figure 6:
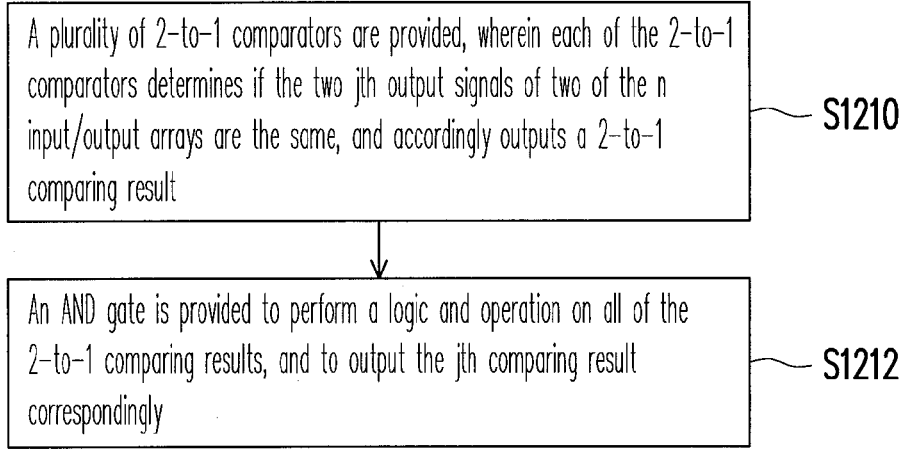
FIG. 6 shows a flow diagram of providing comparing circuits according to an embodiment of the invention.

FIG. 6 shows a flow diagram of providing comparing circuits according to an embodiment of the invention. Referring to FIG. 6, the step S1200 of providing comparing circuits includes steps S1210 and S1212. In the step S1210, a plurality of 2-to-1 comparators are provided. Each of the 2-to-1 comparators determines if the two $j^{th}$ output signals of two of the n input/output arrays are the same, and accordingly outputs a 2-to-1 comparing result. In the step S1212, an AND gate is provided to perform a logic and operation on all of the 2-to-1 comparing results, and to output the $j^{th}$ comparing result correspondingly.

Thus, for the 2-to-1 comparator, if the $1^{st}$ output signals are the same, for example, they are both "0" or both "1", the 2-to-1 comparing results is "1". If not, the 2-to-1 comparing results is "0". For the AND gate, if the 2-to-1 comparing results are both "1", the $1^{st}$ comparing result is "1". If not, the $1^{st}$ comparing result is "0". Therefore, if the $1^{st}$ output signals are "1110", then one 2-to-1 comparing results may be "1" and another 2-to-1 comparing results may be "0", furthermore, the $1^{st}$ comparing result is "0". Hence, it is determined that the $1^{st}$ output signals ("1110") of the $1^{st}$ output signal bus are different by the comparing circuit. The test for finding whether some specific faults exist can be done by the comparing circuit of the test circuit.

Figure 7:
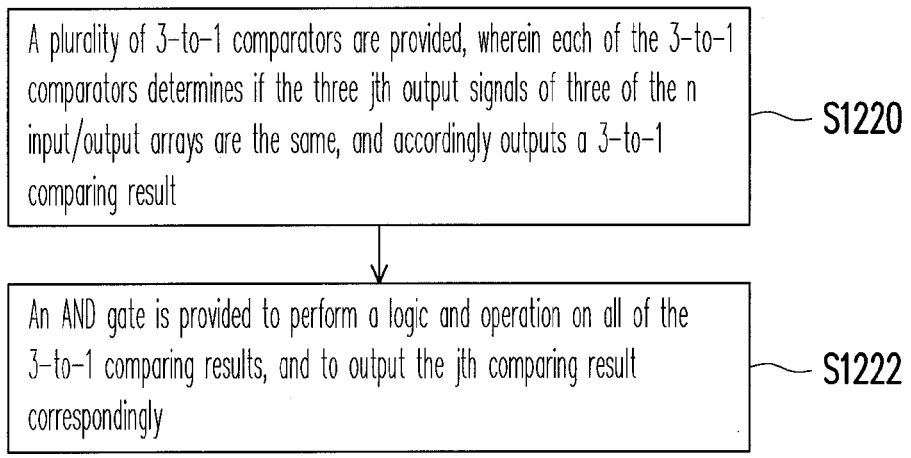
FIG. 7 shows a flow diagram of providing comparing circuits according to another embodiment of the invention.

FIG. 7 shows a flow diagram of providing comparing circuits according to another embodiment of the invention. Referring to FIG. 7, the step S1200 of providing comparing circuits includes steps S1220 and S1222. In the step S1220, a plurality of 3-to-1 comparators are provided. Each of the 3-to-1 comparators determines if the three $j^{th}$ output signals of three of the n input/output arrays are the same, and accordingly outputs a 3-to-1 comparing result. In the step S1222, an AND gate is provided to perform a logic and operation on all of the 3-to-1 comparing results, and to output the $j^{th}$ comparing result correspondingly.

Thus, for the 3-to-1 comparator, if the $1^{st}$ output signals are the same, for example, they are all "0" or all "1", the 3-to-1 comparing results is "1". If not, the 3-to-1 comparing results is "0". For the AND gate, if the 3-to-1 comparing results are "1", the $1^{st}$ comparing result is "1". If not, the $1^{st}$ comparing result is "0". Therefore, if the $1^{st}$ output signals are "1100", then one 3-to-1 comparing results may be "0" and another 3-to-1 comparing results may be "0", furthermore, the $1^{st}$ comparing result may be "0". Hence, it is determined that the $1^{st}$ output signals ("1100") of the $1^{st}$ output signal bus are different by the comparing circuit, even if two $1^{st}$ output signals as "1" are different with another two $1^{st}$ output signals as "0". The test for finding whether some specific faults exist can be done by the comparing circuit of the test circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A test circuit for n input/output arrays, wherein each of the n input/output arrays has M pairs of input/output, and the test circuit comprising:
   M write drivers, wherein the $i^{th}$ write driver provides an $i^{th}$ test signal to the $i^{th}$ inputs of all of the n input/output arrays, and $1 \leq i \leq M$; and
   M comparing circuits, wherein the $j^{th}$ comparing circuit determines if $j^{th}$ output signals of all of the n input/output arrays are the same, and outputs a $j^{th}$ comparing result correspondingly, and $1 \leq j \leq M$.

2. The test circuit of claim 1, further comprising:
   M buffers, coupled between the M write drivers and the M comparing circuits, for buffering the M comparing results.

3. The test circuit of claim 1, wherein each of the M comparing circuits comprises:
   a plurality of 2-to-1 comparators, wherein each of the 2-to-1 comparators determines if the two $j^{th}$ output signals of two of the n input/output arrays are the same, and accordingly outputs a 2-to-1 comparing result; and
   an AND gate, for performing a logic and operation on all of the 2-to-1 comparing results, and outputting the $j^{th}$ comparing result correspondingly.

4. The test circuit of claim 1, wherein each of the M comparing circuits comprises:
   a plurality of 3-to-1 comparators, wherein each of the 3-to-1 comparators determines if the three $j^{th}$ output signals of three of the n input/output arrays are the same, and accordingly outputs a 3-to-1 comparing result; and
   an AND gate, for performing a logic and operation on all of the 3-to-1 comparing results, and outputting the $j^{th}$ comparing result correspondingly.

5. The test circuit of claim 1, wherein n is equal to M.

6. A storage device, comprising:
   n input/output arrays, each of the n input/output arrays has M pairs of input/output; and
   a test circuit, coupled to the n input/output arrays, comprising:
   M write drivers, wherein the $i^{th}$ write driver provides an $i^{th}$ test signal to the $i^{th}$ inputs of all of the n input/output arrays, and $1 \leq i \leq M$; and
   M comparing circuits, wherein the $j^{th}$ comparing circuit determines if $j^{th}$ output signals of all of the n input/output arrays are the same, accordingly outputs a $j^{th}$ comparing result, and $1 \leq j \leq M$.

7. The storage device of claim 6, wherein the test circuit further comprising:
   M buffers, coupled between the M write drivers and the M comparing circuits, for buffering the M comparing results.

8. The storage device of claim 6, wherein each of the M comparing circuits comprises:
   a plurality of 2-to-1 comparators, wherein each of the 2-to-1 comparators determines if the two $j^{th}$ output signals of two of the n input/output arrays are the same, and accordingly outputs a 2-to-1 comparing result; and
   an AND gate, for performing a logic and operation on all of the 2-to-1 comparing results, and outputting the $j^{th}$ comparing result correspondingly.

9. The storage device of claim 6, wherein each of the M comparing circuits comprises:
   a plurality of 3-to-1 comparators, wherein each of the 3-to-1 comparators determines if the three $j^{th}$ output signals of three of the n input/output arrays are the same, and accordingly outputs a 3-to-1 comparing result; and
   an AND gate, for performing a logic and operation on all of the 3-to-1 comparing results, and outputting the $j^{th}$ comparing result correspondingly.

10. The storage device of claim 6, wherein n is equal to M.

11. A method of testing n input/output arrays, wherein each of the n input/output arrays has M pairs of input/output, and the method comprising:
    providing M write drivers, wherein the $i^{th}$ write driver outputs a test signal to the $i^{th}$ inputs of all of the n input/output arrays, and $1 \leq i \leq M$; and
    providing M comparing circuits, wherein the $j^{th}$ comparing circuit determines if $j^{th}$ output signals of all of the n input/output arrays are the same, and outputs a $j^{th}$ comparing result correspondingly, and $1 \leq j \leq M$.

12. The method of claim 11, further comprising:
    providing M buffers coupled between the M write drivers and the M comparing circuits, so as to buffer the M comparing results.

13. The method of claim 11, wherein a step of providing M comparing circuits comprises:
    providing a plurality of 2-to-1 comparators, wherein each of the 2-to-1 comparators determines if the two $j^{th}$ output signals of two of the n input/output arrays are the same, and accordingly outputs a 2-to-1 comparing result; and
    providing an AND gate to perform a logic and operation on all of the 2-to-1 comparing results, and to output the $j^{th}$ comparing result correspondingly.

14. The method of claim 11, wherein a step of providing M comparators comprises:
    providing a plurality of 3-to-1 comparators, wherein each of the 3-to-1 comparators determines if the three $j^{th}$ output signals of three of the n input/output arrays are the same, and accordingly outputs a 3-to-1 comparing result; and
    providing an AND gate to perform a logic and operation on all of the 3-to-1 comparing results, and to output the $j^{th}$ comparing result correspondingly.

15. The method of claim 11, wherein n is equal to M.

* * * * *